US009852025B2

(12) United States Patent
Li

(10) Patent No.: US 9,852,025 B2
(45) Date of Patent: Dec. 26, 2017

(54) PROTECTING DATA STORED ON A SOLID STATE DRIVE

(71) Applicant: Shu Li, Santa Clara, CA (US)

(72) Inventor: Shu Li, Santa Clara, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 15/084,224

(22) Filed: Mar. 29, 2016

(65) Prior Publication Data
US 2017/0286213 A1 Oct. 5, 2017

(51) Int. Cl.
| G11C 29/00 | (2006.01) |
| G06F 11/10 | (2006.01) |
| G06F 3/06 | (2006.01) |
| G11C 29/52 | (2006.01) |

(52) U.S. Cl.
CPC .......... *G06F 11/108* (2013.01); *G06F 3/0619* (2013.01); *G06F 3/0655* (2013.01); *G06F 3/0688* (2013.01); *G06F 11/1068* (2013.01); *G06F 11/1072* (2013.01); *G11C 29/52* (2013.01)

(58) Field of Classification Search
CPC ............... G06F 11/108; G06F 11/1068; G06F 11/1072; G06F 3/0688; G06F 3/0655; G06F 3/0619; G11C 29/52
See application file for complete search history.

(56) References Cited

U.S. PATENT DOCUMENTS

| 8,095,577 | B1 | 1/2012 | Faibish et al. |
| 8,363,837 | B2 | 1/2013 | Williams |
| 8,688,899 | B2 | 4/2014 | Nellans et al. |
| 8,756,375 | B2 | 6/2014 | Flynn |
| 8,762,658 | B2 | 6/2014 | Flynn et al. |
| 8,782,344 | B2 | 7/2014 | Talagala et al. |
| 8,825,937 | B2 | 9/2014 | Atkisson et al. |
| 8,922,243 | B2 | 12/2014 | Jayasena et al. |
| 8,966,184 | B2 | 2/2015 | Atkisson |
| 8,984,216 | B2 | 3/2015 | Fillingim |
| 9,047,178 | B2 | 6/2015 | Talagala et al. |
| 9,069,703 | B2 | 6/2015 | Raam |
| 9,092,337 | B2 | 7/2015 | Nellans et al. |
| 9,104,599 | B2 | 8/2015 | Atkisson et al. |
| 9,116,823 | B2 | 8/2015 | Fillingim et al. |
| 9,122,579 | B2 | 9/2015 | Flynn et al. |
| 9,135,185 | B2 | 9/2015 | Loh et al. |
| 9,141,527 | B2 | 9/2015 | Atkisson et al. |
| 9,159,419 | B2 | 10/2015 | Nellans et al. |
| 9,208,071 | B2 | 12/2015 | Talagala et al. |

(Continued)

*Primary Examiner* — Sam Rizk

(57) ABSTRACT

Disclosed are different types of mechanisms for protecting data stored on a solid state drive or device (SSD) without erasing that data and/or without physically destroying the SSD. The different types of mechanisms can be used alone or in combination to prevent data stored on the SSD from being retrieved (accessed and/or read) in a usable or understandable form. The mechanisms include erasing logical-to-physical address mapping information (that is also used for error correction coding and interleaving), erasing compression information, erasing encryption keys, and changing the codec used for error correction coding. Each mechanism can be used online with the SSD installed in a computer system/server.

17 Claims, 4 Drawing Sheets

(56) References Cited

U.S. PATENT DOCUMENTS

| | | |
|---|---|---|
| 9,218,278 B2 | 12/2015 | Talagala et al. |
| 9,223,662 B2 | 12/2015 | Flynn et al. |
| 9,251,052 B2 | 2/2016 | Talagala et al. |
| 9,251,086 B2 | 2/2016 | Peterson et al. |
| 9,305,610 B2 | 4/2016 | Smith et al. |
| 2013/0013980 A1 | 1/2013 | Cideciyan et al. |
| 2013/0179753 A1 | 7/2013 | Flynn et al. |
| 2014/0208004 A1 | 7/2014 | Cohen et al. |
| 2014/0372679 A1 | 12/2014 | Flynn et al. |
| 2015/0046665 A1 | 2/2015 | Higgins et al. |
| 2015/0134930 A1 | 5/2015 | Huang et al. |
| 2015/0242309 A1* | 8/2015 | Talagala ............... G06F 12/0246 711/103 |
| 2015/0261606 A1* | 9/2015 | Chung ................ G06F 11/1072 714/764 |
| 2016/0188424 A1* | 6/2016 | Walls .................. G06F 11/1662 714/6.3 |

\* cited by examiner

PROTECTING DATA STORED ON A SOLID STATE DRIVE

BACKGROUND

Solid state drives or devices (SSDs) are used to implement non-volatile memory in many relatively high-performance computer systems, including, for example, data center servers. In general, these computer systems/servers are periodically replaced with newer models. Memory components such as NAND flash memory-based SSDs conventionally have a significant amount of useful life left when the computer systems are retired. For example, a system with a three-year warranty may utilize SSDs that have a five-year warranty, in which case the system (including its SSD components) may be retired even though the SSDs are still functional and covered by their warranty. Also, SSDs may be removed from service when their warranty expires even if they are still functional; that is, an SSD's actual lifetime may extend well beyond the period covered by its warranty. In general, events such as these can result in regular disposal of SSDs that could otherwise still be used.

Businesses, government agencies, and other types of organizations store tremendous amounts of data on SSDs. Large amounts of that data may be confidential or proprietary and must be protected against unauthorized access and use. SSDs being removed from service can be physically destroyed so that the data cannot be read. However, physical destruction of SSDs has a number of drawbacks. First, it can be time-consuming and labor-intensive. Also, as noted above, SSDs removed from service may still be functional and thus could still be used in some applications even if their performance is somewhat degraded. However, physical destruction of SSDs means that they cannot continue to be used. Large numbers of SSDs are retired with some remaining useful life; costs would be reduced if those SSDs were instead used in less demanding applications in place of newer SSDs.

Another drawback to physical destruction is that the data stored on an SSD, or at least some portions of that data, may still be accessible. Data is stored in SSDs on flash memory dies. The dies are getting smaller and smaller, so it is possible for an entire die to remain intact and the data on that die to remain readable even if the SSD is broken into small pieces. Also, some parts of a broken die may remain intact and the data on those parts may still be readable; even a small part of a broken die may contain a large amount of readable data. Thus, physical destruction may not be an effective way of protecting data.

An alternative to physical destruction is to erase the data from SSDs before the SSDs are removed from the computer system/server. This method allows SSDs to be used in other applications. However, erasing the data takes a long time and consumes large amounts of computational resources and power, and is therefore inefficient.

SUMMARY

Embodiments according to the present invention provide efficient mechanisms for protecting data that is stored on a solid state drive or device (SSD) without erasing that data and/or without physically destroying the SSD. Several different types of mechanisms can be used alone or in combination to prevent data stored on the SSD from being located and retrieved (accessed and/or read) in a usable or understandable form. Consequently, an SSD can be removed from its host system and perhaps reused in another system without having to erase the data stored on the SSD.

In an embodiment, a logical address is mapped to a physical address in the SSD and data is written to the location in the SSD identified by the physical address. First metadata that includes a mapping of the logical address to the physical address is stored in persistent memory on the SSD. When the SSD is to be retired or recycled, the first metadata (mapping information) is erased from the first persistent memory location without erasing the data. Without the first metadata, it is difficult if not impossible to retrieve all or at least some of the stored data.

In an embodiment, prior to writing the data, the data is compressed in the SSD and the compressed data is written to the location in the SSD. Second metadata that includes information needed to decompress the compressed data is stored in a second persistent memory location in the SSD. When the SSD is to be retired or recycled, the second metadata (compression information) is erased from the second persistent memory location without erasing the compressed data. Without the second metadata, the compressed data cannot be recovered.

In an embodiment, prior to writing the compressed data, the compressed data is encrypted in the SSD and the encrypted data is written to the location in the SSD. A key needed to decrypt the encrypted data is stored in a third persistent memory location in the SSD. When the SSD is to be retired or recycled, the key is erased from the third persistent memory location without erasing the encrypted data. Without the key, decryption cannot be successfully performed.

In an embodiment, prior to writing the compressed data, the compressed data is error-correction-coded with a codec in the SSD and the encoded data written to the location in the SSD. In such an embodiment, a seed used by the codec for error correction coding is generated using the logical address and the physical address mapped from the logical address. Thus, the codec relies on the logical and physical addresses included in the first metadata, so once the first metadata is erased as described above, error correction decoding cannot be successfully performed. Furthermore, in an embodiment, when the SSD is to be retired or recycled, the value(s) of one or more parameters used by the codec can be changed to essentially create a new codec in the SSD that cannot be used to decode the encoded data stored on the SSD.

In an embodiment, prior to writing the encoded data, the encoded data is interleaved in the SSD and the interleaved data is written to the location in the SSD. In such an embodiment, the interleaving block/module utilizes the aforementioned seed and thus indirectly relies on the logical and physical addresses included in the first metadata, so once the first metadata is erased as described above, the interleaved data cannot be successfully de-interleaved.

In an embodiment, the compressed data is encrypted as described above, and the encrypted data is error-correction-coded and interleaved.

The various mechanisms described above—e.g., erasing logical-to-physical address mapping information (first metadata that is also used for error correction coding and interleaving), erasing compression information (second metadata), erasing encryption keys, and/or changing the codec—can be performed online with the SSD installed in the computer system/server. By using each or a combination of these mechanisms, it is not necessary to expend resources to physically destroy or erase the SSD. Also, the SSD can continue to be used and its lifetime extended, costs are reduced, and data stored on the SSD remains protected because it is not possible to retrieve usable or understandable forms of the data from the SSD.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Figure 1:
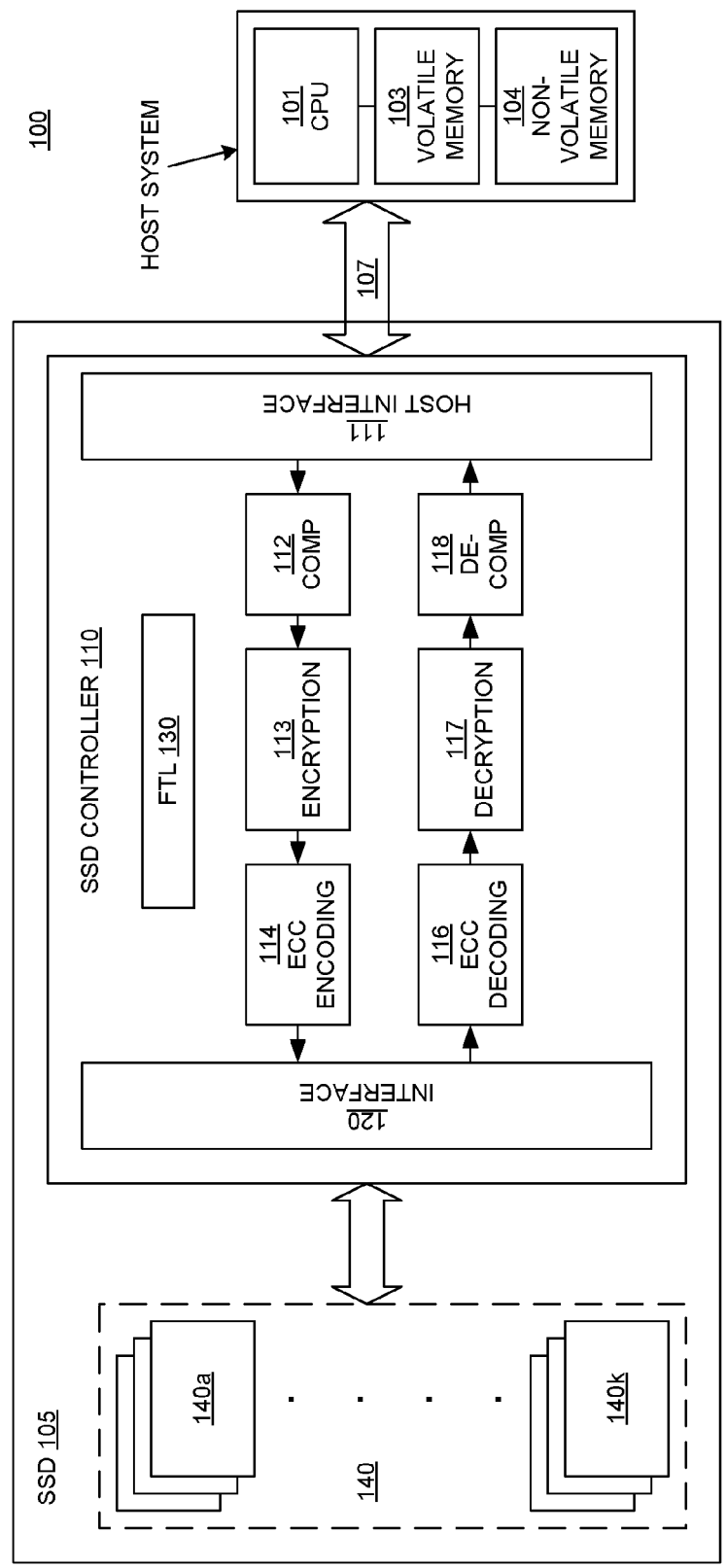
FIG. 1 is a block diagram illustrating elements of a computer system in an embodiment according to the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "mapping," "storing," "reading," "writing," "erasing," "compressing," "decompressing," "encrypting," "decrypting," "error-correction-coding," "error-correction-decoding," "interleaving," "de-interleaving," "generating," "changing," "inputting," or the like, refer to actions and processes (e.g., flowchart 600 of FIG. 6) of an apparatus or computer system or similar electronic computing device or processor (e.g., the computer system 100 of FIG. 1). A computer system or similar electronic computing device manipulates and transforms data represented as physical (electronic) quantities within memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory (e.g., an SSD) or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

FIG. 1 is a block diagram illustrating elements of a computer system 100 in an embodiment according to the present invention. The computer system 100 may include elements other than those shown. The computer system 100 may be used as a server in a data center, for example.

In the example of FIG. 1, the computer system 100 includes a central processing unit (CPU) 101, volatile memory 103, and non-volatile memory 104. The volatile memory 103 may be, for example, dynamic random access memory (DRAM). The CPU 103, volatile memory 103, and non-volatile memory 104 constitute elements of what may be referred to as a host system. The host system may include elements other than those shown or described herein.

The computer system 100 is coupled to or incorporates a solid state drive or device (SSD) 105, which may also be known as a non-volatile memory device (NVMD) or a flash memory device. There can be more than one such device (e.g., SSD) coupled to or included in the computer system 100. In an embodiment, the SSD 105 is coupled to the CPU 101 via a host bus interface (HBI) 107, which may be a Serial Advanced Technology Attachment (SATA) bus or a Peripheral Component Interface Express (PCIe) bus, although embodiments according to the present invention are not so limited.

The SSD 105 includes a controller 110, which may be referred to as a master controller or SSD controller, and a number of non-volatile storage elements, specifically a number of dies or chips 140a-140k that are used to store data. There may be any number of dies. The dies 140a-140k may be singularly referred to as the die 140a and collectively referred to as the dies 140. In an embodiment, the dies 140 are NAND dies, and as such the SSD 105 may be referred to as a NAND flash device. Alternatively, the dies may include NOR flash elements. The SSD 105 may include elements other than those shown or described below.

The controller 110 can be implemented as an application-specific integrated circuit (ASIC) or field-programmable gate array (FPGA) that is embedded in the SSD 105. In general, the controller 110 includes control circuitry that facilitates reading, writing, erasing, and other operations performed on the dies 140. In the embodiment of FIG. 1, the controller 110 executes or includes a flash translation layer (FTL) 130, which may be implemented in firmware or as software. The FTL 130 translates logical addresses (logical block addresses) from the host system to physical addresses (physical block addresses) on the SSD 105. The FTL 130 can also perform other functions such as garbage collection, wear leveling, and bad block management. The FTL 130 is further described below in conjunction with FIG. 2.

Continuing with reference to FIG. 1, the controller 110 also includes a write path and a read path. The write path starts at the host interface 111, which includes, for example, a physical layer (PHY) interface and a serializer/deserializer that converts data between the analog and digital domains (from analog to digital, and from digital to analog). In the FIG. 1 embodiment, the write path includes a data compression (COMP) block 112, an encryption (ENC) block 113, and an error correction code (ECC) encoding block 114. The SSD controller 110 is coupled to the dies 140 via an interface 120 (e.g., an Open NAND Interface, ONFI). Data is moved to the dies 140 using a synchronous and asynchronous trigger mode (toggle). A chip select signal can be used by the controller 110 to locate, address, and/or activate a particular one of the dies 140.

Data is moved to the read path from the dies 140 via the same toggle mechanism and interface 120. In the FIG. 1 embodiment, the read path includes an ECC decoding (DEC) block 116, a decryption block 117, and a decompression (DECOMP) block 118.

Figure 2:
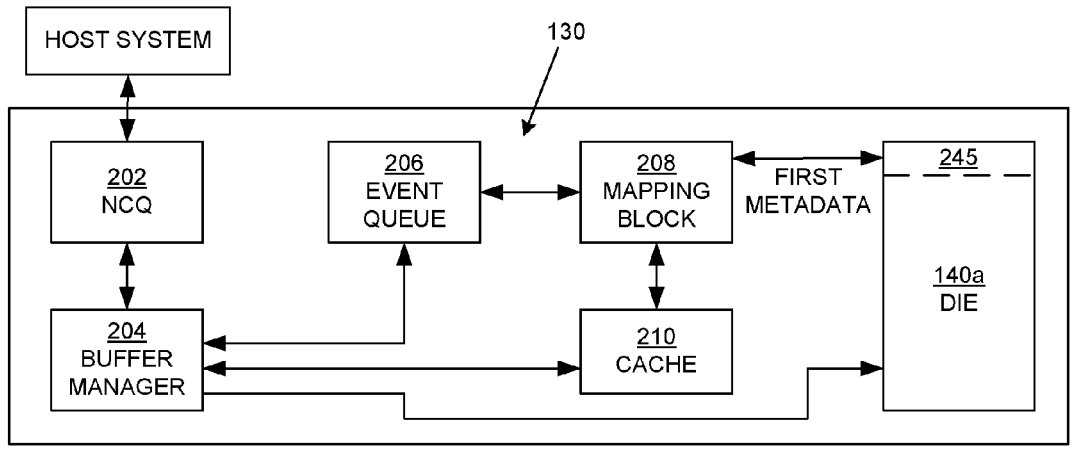
FIG. 2 is a block diagram illustrating elements of a flash translation layer in an SSD in an embodiment according to the present invention.

FIG. 2 is a block diagram illustrating elements of the FTL 130 in the SSD 105 in an embodiment according to the present invention. To execute a write operation (to write data to the SSD 105), the host system (FIG. 1) issues a write command including the data to be written and a logical block address (logical address). The write command is placed into the Native Command Queue (NCQ) 202. Then, the command and data are transferred to the buffer manager 204, which processes the command and adds the command into the event queue 206 for further processing.

The mapping block 208 of FIG. 2 maps the logical address included in the command to a physical address corresponding to a physical location in the NAND dies 140 (FIG. 1). As part of selecting a physical location to write the data to, the mapping block 208 performs wear leveling to ensure that the dies 140 are evenly used, garbage collection to reclaim memory blocks previously deleted by the host system, and bad block management to handle invalid blocks. The mapping of the logical address to the physical address is added to mapping information (e.g., a mapping table) that is stored in the cache 210, which may be volatile memory such as DRAM. The mapping table includes other mappings of logical addresses to physical addresses.

The data is then committed to (written to) the selected physical location in the dies 140. Also, the mapping information in the cache 210 is periodically loaded into a non-volatile memory location. In an embodiment, the mapping information is stored in the area 245 of one of the NAND dies (e.g., the die 140a); thus, the mapping information is persistently stored in a memory location in the SSD. During subsequent operations, the mapping information in the area 245 is periodically updated. The mapping information stored in the area 245 may be referred to herein as the first metadata.

Embodiments according to the present invention are not limited to the type of FTL discussed in conjunction with FIG. 2. In general, the FTL 130 maintains and stores mapping information (first metadata) that includes a mapping of logical addresses to physical addresses on the SSD. As such, the first metadata (mapping information) is important for reading data from the SSD 105.

With reference back to the embodiment of FIG. 1, data on the write path flows through the compression block 112, the encryption block 113, and the ECC encoding block 114 in sequence. Each of these blocks modifies the data so that the data that is stored on the SSD 105 (specifically, in the dies 140) is different from the data that is received from the host system.

The compression block 112 compresses the data received from the host system, producing compressed data. The compression block 112 also generates metadata, which may be referred to herein as compression metadata or second metadata, that is different from the mapping information (first metadata) described above. Different sets of data (e.g., files) may have different compression ratios. For example, an eight (8) kilobyte (KB) first file may be compressed to four (4) KB, while an 8 KB second file may be compressed to five (5) KB. In an embodiment, data is written in units of pages (e.g., 8 KB); a page is the smallest addressable unit in the SSD 105. Thus, in this example, the compressed first file and 4 KB of the compressed second file may be combined and written to a first page, and the remaining one KB of the compressed second file may be combined with data from another file and written to another page. The compression metadata generated by the compression block 112 records the compression ratio and other information, such as information that describes that the compressed second file is stored as two different pages. As such, the compression metadata (second metadata) is important for assembling and decompressing the stored data as part of the process for generating the original data received from the host system when the data is read from the SSD 105.

Figure 3:
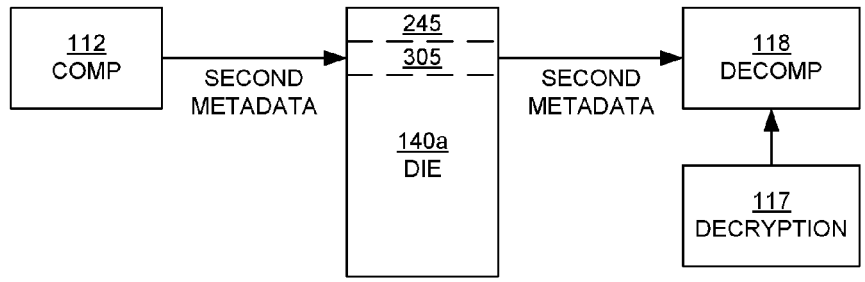
FIG. 3 is a block diagram illustrating storage of compression information in an embodiment according to the present invention.

With reference also to FIG. 3, in an embodiment, the compression (second) metadata is stored in the area 305 of one of the NAND dies (e.g., the die 140a); thus, the compression metadata is persistently stored in a memory location in the SSD 105. Although the area 305 is illustrated as being on the same die as the area 245, the invention is not so limited. On the read path, the decompression block 118 can access the area 305, retrieve the compression metadata, and use the compression metadata to decompress the data received from the decryption block 117.

With reference again to the embodiment of FIG. 1, the encryption block 113 encrypts the compressed data that is output from the compression block 112, producing encrypted and compressed data (which may be referred to herein as simply encrypted data). In an embodiment, a key is used for data encryption. Contemporary encryption processes like the Advanced Encryption Standard (AES) use powerful 256-bit keys. As such, the key used to encrypt the compressed data is important for decrypting the data as part of the process for generating the original data received from the host system when the data is read from the SSD 105. In an embodiment, encryption is not performed, in which case the encryption block 113 is either not included in the write path or is bypassed.

Figure 4:
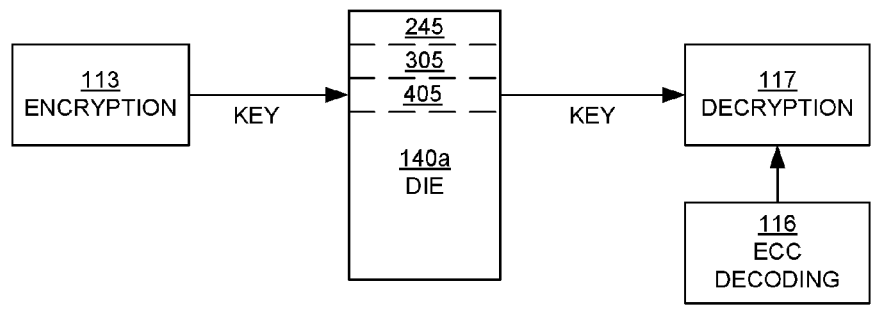
FIG. 4 is a block diagram illustrating storage of an encryption key in an embodiment according to the present invention.

With reference also to FIG. 4, in an embodiment, the key is stored in the area 405 of one of the NAND dies (e.g., the die 140*a*); thus, the key is persistently stored in a memory location in the SSD 105. Although the area 405 is illustrated as being on the same die as the area 245 (and the area 305), the invention is not so limited. On the read path, if the data is encrypted, then the decryption block 117 can access the area 405, retrieve the key, and use the key to decrypt the data received from the ECC decoding block 116.

Figure 5:
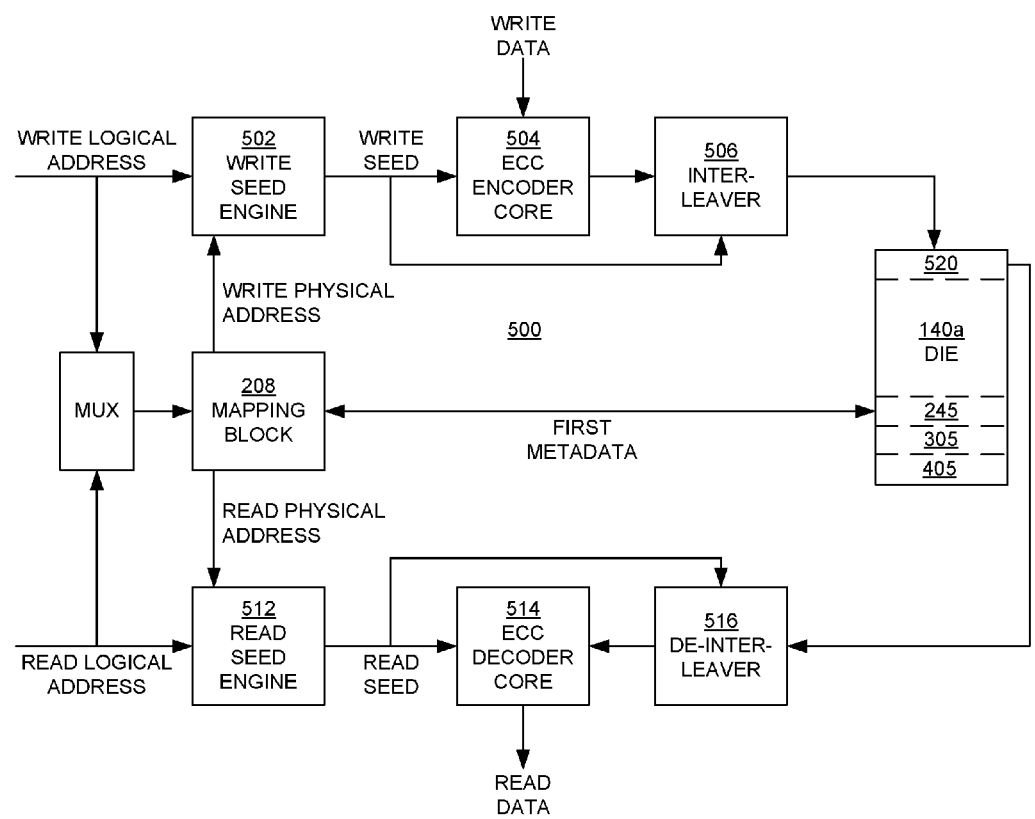
FIG. 5 is a block diagram illustrating elements of a codec for error correction coding and decoding in an embodiment according to the present invention.

FIG. 5 is a block diagram illustrating elements of a codec 500 for error correction coding and decoding in an embodiment according to the present invention. Elements of the codec 500 are used in the ECC encoding block 114 and the ECC decoding block 116 of FIG. 1.

In an embodiment, the codec 500 includes a write seed engine 502 and an ECC encoder core 504 on the write path. In such an embodiment, the write seed engine 502 and the ECC encoder core 504 can be included in the ECC encoding block 114 of FIG. 1. In an embodiment, the codec 500 also includes an interleaver 506 on the write path, downstream of the ECC encoding block 114.

In an embodiment, the codec 500 includes a read seed engine 512 and an ECC decoder core 514 on the read path. In such an embodiment, the read seed engine 512 and the ECC decoder core 514 can be included in the ECC decoding block 116 of FIG. 1. In an embodiment, the codec 500 also includes a de-interleaver 516 on the read path, upstream of the ECC decoding block 116.

In the FIG. 5 embodiment, in a write operation, the write seed engine 502 receives the write logical address and the write physical address mapped to that logical address as inputs and generates a write seed. For example, the logical and physical addresses can be prepended to the data for the ECC parity computation, and then removed before the write data is stored in the SSD 105. In an embodiment, the write logical address is received from the host system and the write physical address is received from the FTL mapping block 208. As described above in conjunction with FIG. 2, logical-to-physical address mapping information is stored as first metadata in a persistent memory location on the SSD 105.

Continuing with reference to FIG. 5, the write seed and the encrypted data from the encryption block 113 (if the data is encrypted) or the data from the compression block 112 (if the data is not encrypted) is input to the ECC encoder core 504, which generates encoded, optionally encrypted data (which may be referred to herein as simply encoded data). In an embodiment, the write seed and the encoded data are interleaved in the interleaver 506 to generate interleaved, encoded data (which may be referred to herein as simply interleaved data). The interleaver 506 can take an n-bit write seed and convert the encoded sequence of data into any one of $2^n$ formats. In an embodiment, the seed is 64 bits long (n=64). With that many possible formats, an attempt to read the interleaved data without knowing the seed value by exhaustive or brute-force hacking would take too long to complete to be of any use. As such, the seed used to ECC encode and interleave the encrypted data is important for decoding the data as part of the process for generating the original data received from the host system when the data is read from the SSD 105.

The interleaved data from the interleaver 506 is stored in the dies 140 at the physical memory location corresponding to the physical address selected by the FTL mapping block 208 (e.g., the location 520). In the FIG. 5 embodiment, to read the data from the location 520 in response to a request from the host system, the read seed engine 512 receives a read logical address for that location and the read physical address mapped to that logical address as inputs and generates a read seed (thus, in this example, the read and write logical addresses are the same, and the read and write physical addresses are the same). In this embodiment, the read seed engine 512 uses the same seed generator as the write seed engine 502. In an embodiment, the read logical address is received from the host system and the read physical address is received from the FTL mapping block 208. As described above in conjunction with FIG. 2, logical-to-physical address mapping information is stored as first metadata in a persistent memory location on the SSD 105. Thus, the codec 500 (specifically, the read seed engine 512) relies on the first metadata stored in the area 245 of the dies 140.

The data read from the location 520 of FIG. 5 is interleaved data (that is also compressed, optionally encrypted, and encoded as described above). The read seed and the interleaved data are input to the de-interleaver 516, which de-interleaves the data. The read seed and the de-interleaved data are input to the ECC decoder core 514, which decodes the data (which is still compressed and may also be encrypted). Thus, the first metadata (mapping information) is important for de-interleaving and decoding the data on the read path, because that metadata is used for generating the read seed.

With reference back to FIG. 1, if the data is encrypted, then the de-interleaved and decoded data is input to the decryption block 117, which decrypts the data using the encryption key stored in the area 405 of the dies 140. Thus, the key is important for decrypting the data on the read path. If encryption is not performed, then the decryption block 117 is either not included on the read path or is bypassed.

The decrypted data (which is still compressed) is input to the decompression block 118, which decompresses the data using the second metadata (compression information) stored in the area 305 of the dies 140. Thus, the second metadata is important for decompressing the data on the read path.

The data from the decompression block 118 can then be forwarded to the host system.

At some point in time, the SSD 105 is to be removed from service. For example, the SSD 105 may be retired, or it may be removed from its current computer system and installed in another computer system. However, instead of erasing the data stored on the SSD 105 and/or physically destroying the SSD, embodiments according to the invention utilize a variety of mechanisms (described below) for protecting data on the SSD, so that a usable or understandable form of that data cannot be retrieved from the SSD. Those mechanisms do not preclude erasing the SSD, but make erasing the SSD optional.

As described above, the data stored on the SSD 105 is compressed, encrypted, encoded, and/or interleaved. The mechanisms for protecting the data stored on the SSD 105 include erasing logical-to-physical address mapping information (the first metadata, which is also used for error correction decoding and de-interleaving the data on the read path), erasing compression information (the second metadata, which is used for decompressing the data on the read path), and erasing encryption keys (used for decrypting the data on the read path). These mechanisms can be used alone or in combination to prevent data stored on the SSD 105 from being retrieved (accessed and/or read) in a usable or understandable form.

Another mechanism that can be utilized includes changing the codec 500. With reference again to FIG. 5, the codec 500 includes seed engines 502 and 512 as described above. The write seed engine 502 operates on data on the write path; thus, data stored in the SSD 105 has been encoded according to the seed generator used in the write seed engine. In an embodiment, to protect data stored on the SSD 105, the values of one or more parameters used by the read seed engine 512 can be changed. This can be accomplished while the SSD 105 remains online, by changing programmable values in a register interface. By changing the value(s) of parameter(s) in the read seed engine 512, the logical and physical addresses input into the read seed engine will not result in the same seed that was generated when those addresses were input into the write seed engine 502. Thus, the encoded data stored at the physical address cannot be decoded using the seed generated by the read seed engine 512.

Each of the disclosed mechanisms can be used online with the SSD installed in the computer system/server. Once these mechanisms have been executed, it may be possible to retrieve data from the SSD but that data will not be readable and thus is not usable or understandable.

Figure 6:
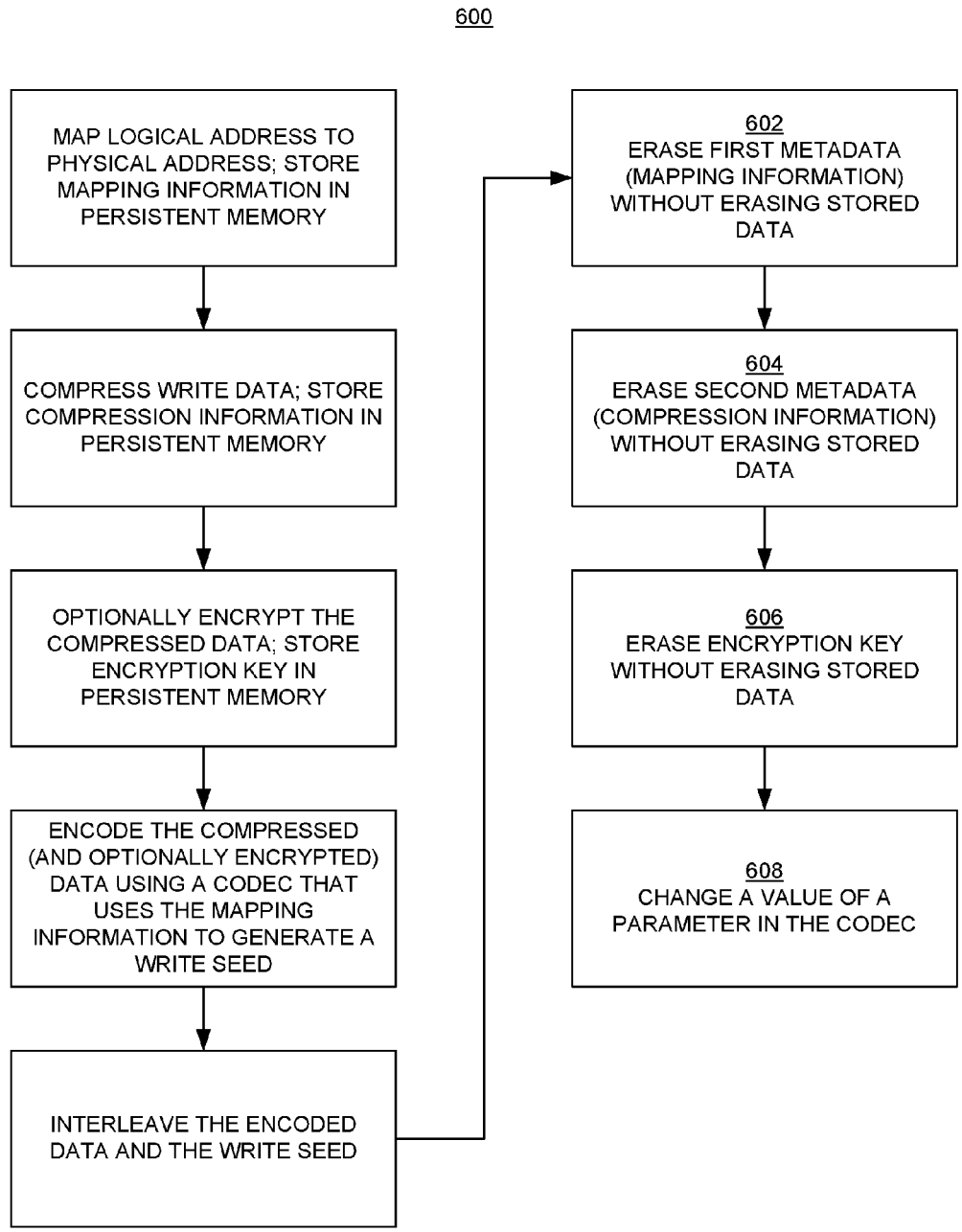
FIG. 6 is a flowchart illustrating operations in a method of preventing retrieval of data from an SSD in an embodiment according to the present invention.

FIG. 6 is a flowchart 600 illustrating operations in a method of preventing retrieval of usable or understandable data from a solid state drive (e.g., the SSD 105 of FIG. 1) in an embodiment according to the present invention. The method prevents data that is stored on the SSD from being located and read in a usable or understandable format.

In an embodiment, as previously described herein, a logical address is mapped to a physical address in the SSD, data is written to a location in the SSD identified by the physical address, and first metadata that includes a mapping of the logical address to the physical address is stored in persistent memory on the SSD. In block 602, the first metadata (mapping information) is erased from the first persistent memory location without erasing the data. Without the mapping information, it is difficult if not impossible to retrieve all or at least some of the stored data.

In an embodiment, prior to writing the data, the data is compressed in the SSD and the compressed data is written to the location in the SSD, and second metadata that includes information needed to decompress the compressed data is stored in a second persistent memory location in the SSD, as previously described herein. In block 604, the second metadata (compression information) is erased from the second persistent memory location without erasing the compressed data. Without the compression metadata, the compressed data cannot be recovered.

In an embodiment, prior to writing the compressed data, the compressed data is encrypted in the SSD and the encrypted data is written to the location in the SSD, and a key needed to decrypt the encrypted data is stored in a third persistent memory location in the SSD, as previously described herein. In block 606, the key is erased from the third persistent memory location without erasing the encrypted data. Without the key, decryption cannot be successfully performed.

In an embodiment, prior to writing the compressed data, the compressed data is error-correction-coded with a codec in the SSD and the encoded data written to the location in the SSD, as previously described herein. In an embodiment, the compressed data is also encrypted. In such an embodiment, a seed used by the codec for error correction coding is generated using the logical address and the physical address mapped from the logical address as described in conjunction with FIG. 5. Thus, the codec relies on the logical and physical addresses included in the first metadata, so that once the first metadata is erased as described above (in block 602), error correction decoding cannot be successfully performed. Furthermore, in an embodiment, in block 608, the value(s) of one or more parameters used by the codec can be changed to essentially create a new codec in the SSD that cannot be used to decode the encoded data stored on the SSD.

In an embodiment, prior to writing the encoded data, the encoded data is interleaved with the write seed using an interleaver in the SSD and the interleaved data is written to the location in the SSD. In such an embodiment, because the interleaver uses the write seed generated from the logical and physical addresses (the first metadata), the de-interleaver at least indirectly relies on the first metadata, so once the first metadata is erased as described above (in block 602), the interleaved data cannot be successfully de-interleaved.

Thus, various mechanisms—including erasing logical-to-physical address mapping information (that is also used for error correction coding and interleaving), erasing compression information, erasing encryption keys, and changing the codec used for error correction coding—performed by modules or functional blocks on an SSD can be integrated so that the SSD does not have to be physically destroyed and instead can be reused or recycled without having to erase data on the SSD beforehand. The mechanisms can be performed with the SSD in place in its current computer system before the SSD is removed from that computer system and installed in another computer system, and multiple SSDs can be treated in parallel. Relatively small amounts of data (e.g., the first metadata, the second metadata, and the encryption key) are erased, so the amount of computational resources used to reduce data is smaller than the resources consumed if the stored data is erased from the SSDs. Also, the time needed to erase the first and second metadata and encryption key is relatively short, so SSDs can be recycled quickly.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments according to the invention are thus described. While the present disclosure has been described in particular embodiments, it should be appreciated that the invention should not be construed as limited by such embodiments, but rather construed according to the following claims.

What is claimed is:

1. A method of protecting data that is stored on a solid state drive (SSD), the method comprising:
   compressing the data to produce compressed data;
   mapping a logical address to a physical address in the SSD and writing the compressed data to a location in the SSD identified by the physical address;
   storing, in a first persistent memory location in the SSD, first metadata comprising a map from the logical address to the physical address for the location where the compressed data is stored;
   storing, in a second persistent memory location in the SSD, second metadata comprising information for decompressing the compressed data; and
   erasing the second metadata from the second persistent memory location without erasing the compressed data.

2. The method of claim 1, further comprising:
   prior to said writing, encrypting the compressed data to produce encrypted compressed data, wherein the compressed data written to the location identified by the physical address comprises the encrypted compressed data;
   storing, in a third persistent memory location in the SSD, a key comprising information for decrypting the encrypted compressed data; and
   erasing the key from the third persistent memory location without erasing the encrypted compressed data.

3. The method of claim 1, further comprising, prior to said writing, error-correction-coding the compressed data with a codec to produce encoded compressed data, wherein the compressed data written to the location identified by the physical address comprises the encoded compressed data, and wherein further error-correction-decoding the encoded compressed data depends on the first metadata.

4. The method of claim 3, further comprising, prior to said writing, interleaving the encoded compressed data to produce interleaved encoded compressed data, wherein the compressed data written to the location identified by the physical address comprises the interleaved encoded compressed data, and wherein further de-interleaving the interleaved encoded compressed data depends on the first metadata.

5. The method of claim 3, further comprising generating a seed as an input to the codec, wherein the seed is generated using the logical address and the physical address mapped from the logical address.

6. The method of claim 3, wherein the encoded compressed data that is output from the codec is a function of a value of a parameter of the codec, wherein the method further comprises, with the encoded compressed data still stored at the location identified by the physical address, changing the value of the parameter.

7. A computer system, comprising:
   a memory;
   a processor coupled to the memory; and
   a solid state drive (SSD) coupled to the processor and comprising a controller and a plurality of non-volatile memories, the controller configured to prevent data that is stored on the SSD from being located and read, the controller operable for:
   compressing the data to produce compressed data;
   mapping a logical address to a physical address in the SSD and writing the compressed data to a first non-volatile memory location in the SSD identified by the physical address;
   storing, in a second non-volatile memory location in the SSD, first metadata comprising a map from the logical address to the physical address for the first non-volatile memory location where the compressed data is stored;
   storing, in a third non-volatile memory location in the SSD, second metadata comprising information for decompressing the compressed data; and
   with the compressed data stored at the first non-volatile memory location, erasing the second metadata from the third non-volatile memory location.

8. The computer system of claim 7, wherein the SSD is further operable for: encrypting the compressed data prior to writing the compressed data to produce encrypted compressed data, wherein the compressed data written to the first non-volatile memory location comprises the encrypted compressed data; storing, in a fourth non-volatile memory location in the SSD, a key comprising information for decrypting the encrypted compressed data; and with the encrypted compressed data stored at the first non-volatile memory location, erasing the key from the fourth non-volatile memory location.

9. The computer system of claim 7, wherein the SSD is further operable for: error-correction-coding the compressed data with a codec prior to writing the compressed data to produce encoded compressed data, wherein the compressed data written to the first non-volatile memory location comprises the encoded compressed data, and wherein further error-correction-decoding the encoded compressed data depends on the first metadata.

10. The computer system of claim 9, wherein the SSD is further operable for interleaving the encoded compressed data prior to writing the encoded compressed data to produce interleaved encoded compressed data, wherein the compressed data written to the first non-volatile memory location comprises the interleaved encoded compressed data, and wherein further de-interleaving the interleaved encoded compressed data depends on the first metadata.

11. The computer system of claim 9, wherein the SSD is further operable for generating a seed that is input to the codec, wherein the seed is generated using the logical address and the physical address mapped from the logical address.

12. The computer system of claim 9, wherein the encoded compressed data that is output from the codec is a function of a value of a parameter of the codec, wherein the SSD is further operable for changing the value of the parameter with the encoded compressed data stored at the first non-volatile memory location.

13. A solid state drive (SSD), comprising:
a plurality of non-volatile storage elements; and
a controller coupled to the storage elements;
the controller operable to execute operations that prevent data that is stored on the SSD from being located and read, the operations comprising:
compressing the data to produce compressed data;
mapping a logical address to a physical address in the SSD and writing the compressed data to a location in a non-volatile storage element in the SSD identified by the physical address;
storing, in a first non-volatile storage location in the SSD, first metadata comprising a map from the logical address to the physical address for the location in the non-volatile storage element where the compressed data is stored;
storing, in a second non-volatile storage location in the SSD, second metadata comprising information for decompressing the compressed data; and
with the compressed data stored at the location identified by the physical address, erasing the second metadata from the second non-volatile storage location.

14. The SSD of claim 13, wherein the controller further comprises an encryption block operable for encrypting the compressed data prior to writing the compressed data to produce encrypted compressed data, wherein the compressed data written to the location identified by the physical address comprises the encrypted compressed data; and wherein the controller is further operable for: storing, in a third non-volatile storage location in the SSD, a key comprising information for decrypting the encrypted compressed data; and with the encrypted compressed data stored at the location identified by the physical address, erasing the key from the third non-volatile storage location.

15. The SSD of claim 13, wherein the controller further comprises an error correction coding block operable for: generating a seed using the logical address and the physical address mapped from the logical address; and inputting the seed into a codec for error-correction-coding the compressed data prior to writing the compressed data to produce encoded compressed data, wherein the compressed data written to the location identified by the physical address comprises the encoded compressed data.

16. The SSD of claim 15, wherein the controller further comprises an interleaver block operable for interleaving the encoded compressed data prior to writing the encoded compressed data to produce interleaved encoded compressed data, wherein the compressed data written to the location identified by the physical address comprises the interleaved encoded compressed data, and wherein further de-interleaving the interleaved encoded compressed data depends on the first metadata.

17. The SSD of claim 15, wherein the encoded compressed data that is output from the codec is a function of a value of a parameter of the codec, wherein the controller is further operable for changing the value of the parameter with the encoded compressed data stored at the location identified by the physical address.

* * * * *